United States Patent
Rockenberger et al.

(10) Patent No.: US 6,878,184 B1
(45) Date of Patent: Apr. 12, 2005

(54) NANOPARTICLE SYNTHESIS AND THE FORMATION OF INKS THEREFROM

(75) Inventors: Joerg Rockenberger, Redwood City, CA (US); Fabio Zurcher, Brisbane, CA (US); Scott Haubrich, Castro Valley, CA (US); Nassrin Sleiman, Sunnyvale, CA (US)

(73) Assignee: Kovio, Inc., Sunnyvale, CA (US)

( * ) Notice: Subject to any disclaimer, the term of this patent is extended or adjusted under 35 U.S.C. 154(b) by 62 days.

(21) Appl. No.: 10/215,952

(22) Filed: Aug. 9, 2002

(51) Int. Cl.$^7$ .................................................. B22F 9/24
(52) U.S. Cl. ........................... 75/343; 75/362; 75/371; 106/31.33
(58) Field of Search ........................... 75/343, 362, 371

(56) References Cited

U.S. PATENT DOCUMENTS

| | | | |
|---|---|---|---|
| 4,130,671 A | 12/1978 | Nagesh et al. | 427/125 |
| 4,186,244 A | 1/1980 | Deffeyes et al. | 428/570 |
| 4,381,945 A | 5/1983 | Nair | 106/1.14 |
| 4,418,099 A | 11/1983 | Cuevas et al. | 427/229 |
| 4,463,030 A | 7/1984 | Deffeyes et al. | 427/216 |
| 4,487,811 A | 12/1984 | Eichelberger et al. | 428/546 |
| 4,548,879 A | 10/1985 | St. John et al. | 427/96 |
| 4,599,277 A | 7/1986 | Brownlow et al. | 428/552 |
| 4,650,108 A | 3/1987 | Gallagher | 228/124 |
| 4,775,439 A | 10/1988 | Seeger, Jr. et al. | 156/231 |
| 4,808,274 A | 2/1989 | Nguyen | 204/15 |
| 4,859,241 A | 8/1989 | Grundy | 106/1.14 |
| 4,871,790 A | 10/1989 | Lamanna et al. | 523/333 |
| 5,059,242 A | 10/1991 | Firmstone et al. | 106/1.23 |
| 5,071,826 A | 12/1991 | Anderson et al. | 505/1 |
| 5,075,262 A | 12/1991 | Nguyen et al. | 501/19 |
| 5,147,841 A | 9/1992 | Wilcoxon | 502/173 |
| 5,173,330 A | 12/1992 | Asano et al. | 427/558 |
| 5,183,784 A | 2/1993 | Nguyen et al. | 501/19 |
| 5,250,229 A | 10/1993 | Hara et al. | 252/518 |
| 5,262,357 A | 11/1993 | Alivisatos et al. | 437/233 |
| 5,270,368 A | 12/1993 | Lent et al. | 524/236 |
| 5,338,507 A | 8/1994 | Anderson et al. | 505/470 |
| 5,378,408 A | 1/1995 | Carroll et al. | 252/514 |
| 5,569,448 A | 10/1996 | Wong et al. | 424/9.45 |
| 5,587,111 A | 12/1996 | Watanabe et al. | 252/514 |
| 5,882,722 A | 3/1999 | Kydd | 427/123 |
| 5,922,403 A | 7/1999 | Tecle | 427/212 |
| 5,958,999 A | 9/1999 | Bates et al. | 523/161 |
| 5,966,580 A | 10/1999 | Watanabe et al. | 419/9 |

(Continued)

FOREIGN PATENT DOCUMENTS

| | | | |
|---|---|---|---|
| WO | WO 98/04761 | 2/1998 | C23G/5/06 |
| WO | WO 01/73150 A1 | 10/2001 | C23C/8/00 |
| WO | WO-01/87775 A1 * | 11/2001 | |
| WO | WO 01/88540 A1 | 11/2001 | G01N/33/543 |

OTHER PUBLICATIONS

A. P. Alivisatos, "Electrical Studies of Semiconductor–Nanocrystal Colloids," MRS BULLETIN/Feb. 1998, pp. 18–23.

(Continued)

Primary Examiner—George Wyszomierski
(74) Attorney, Agent, or Firm—Haverstock & Owens LLP

(57) ABSTRACT

Methods for making metal-based nanoparticles and inks are disclosed. In accordance with the method of the present invention, molecular metal precursors are reduced in the presence of a reaction medium to form the nanoparticles. The molecular metal precursors are preferably reduced by heating the metal precursor in the medium, by adding a reducing agent, such an aldehyde or a combination thereof. Metal precursor are preferably metal oxides, transition metal complexes or combination thereof. The method of the present invention is used to make high yield nanoparticles with a range of particle size distributions. Nanoparticle formed by the present invention include mixtures of nanoparticle, alloy nanoparticles, metal core shell nanoparticles or nanoparticle comprising a single metal species.

53 Claims, 7 Drawing Sheets

(1) $M_xO_y \xrightarrow[\text{(medium) } \Delta_T]{\text{Reducing Agent}} M_n + H_2O$ (Reducing Agent = R - COH)

(2) $M(L)_x \xrightarrow[\text{(medium) } \Delta_T]{\text{Reducing Agent}} M_n + L^-$ ($L = NO_3^-, C_2H_5O^-$)

(Reducing Agent = R - COH)

U.S. PATENT DOCUMENTS

| | | | | |
|---|---|---|---|---|
| 6,033,783 | A | 3/2000 | Tanaka et al. | 428/408 |
| 6,139,626 | A | 10/2000 | Norris et al. | 117/68 |
| 6,190,731 | B1 | 2/2001 | Tecle | 427/213.3 |
| 6,194,316 | B1 | 2/2001 | Oda et al. | 438/687 |
| 6,211,285 | B1 * | 4/2001 | Grunbauer et al. | 524/591 |
| 6,254,662 | B1 * | 7/2001 | Murray et al. | 75/348 |
| 6,274,412 | B1 | 8/2001 | Kydd et al. | 438/149 |
| 6,277,448 | B2 | 8/2001 | Strutt et al. | 427/452 |
| 6,294,401 | B1 | 9/2001 | Jacobson et al. | 438/99 |
| 6,303,499 | B1 | 10/2001 | Sato | 438/676 |
| 6,306,594 | B1 | 10/2001 | Cozzette et al. | 435/6 |
| 6,344,271 | B1 | 2/2002 | Yadav et al. | 428/402 |
| 6,358,611 | B1 * | 3/2002 | Nagasawa et al. | 75/362 |
| 6,372,077 | B1 | 4/2002 | Tecle | 156/279 |
| 6,527,843 | B1 * | 3/2003 | Zaima et al. | 106/31.33 |
| 6,572,673 | B2 * | 6/2003 | Lee et al. | 75/362 |
| 6,576,291 | B2 * | 6/2003 | Bawendi et al. | 75/362 |
| 6,585,796 | B2 * | 7/2003 | Hosokura et al. | 75/373 |
| 2002/0018896 | A1 * | 2/2002 | Fukunaga et al. | 75/362 |

OTHER PUBLICATIONS

D. Johnson et al., "Finite Size Effects in Nanoscale Tb Particles," J. Appl. Phys. vol. 79, No. 8, Apr. 15, 1996, pp. 5299–5301.

Diandra L. Leslie–Pelecky et al., "Self–Stabilized Magnetic Colloids: Ultrafine Co Particles in Polymers," J. Appl. Phys., vol. 79, No. 8, Apr. 15, 1996, pp. 5312–5314.

C. B. Murray et al., "Self–Organization of CdSe Nanocrystallites into Three–Dimensional Quantum Dot Superlattices," Science, vol. 270, Nov. 24, 1995, pp. 1335–1338.

Chinmay Damle et al., "Synthesis of Ag/Pd Nanoparticles and Their Low–Temperature Alloying within Thermally Evaporated Fatty Acid Films," J. Phys. Chem. B 2002, 106, pp. 297–302.

Vijaya Patil et al., "Evidence for Novel Interdigitated Bilayer Formation of Fatty Acids during Three–Dimensional Self–Assembly on Silver Colloidal Particles," J. Am. Chem. Soc. 1997, 119 pp. 9281–9282.

Wei Wang et al., "Silver Nanoparticles Capped by Long–Chain Unsaturated Carboxylates," J. Phys. Chem. B 1999, 103, 7238–7246.

* cited by examiner (1) $M_xO_y \xrightarrow[\text{(medium) } \Delta_T]{\text{Reducing Agent}} M_n + H_2O$ (Reducing Agent = R - COH)

(2) $M(L)_x \xrightarrow[\text{(medium) } \Delta_T]{\text{Reducing Agent}} M_n + L^-$ $(L = NO_3^-, C_2H_5O^-)$ (Reducing Agent = R - COH)

*Fig. 1*

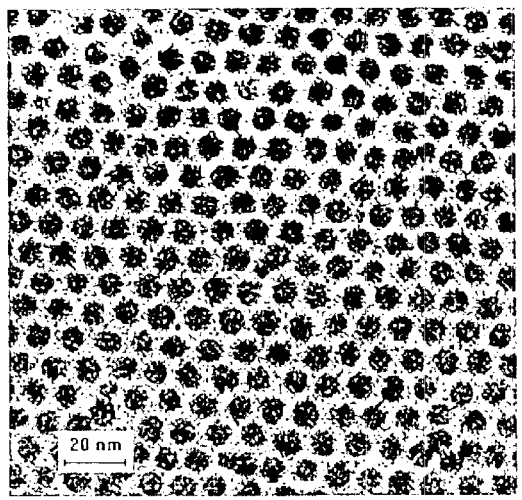
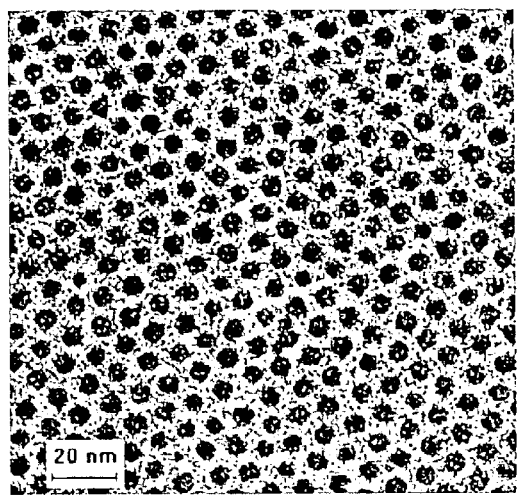
Fig. 7A            Fig. 7B
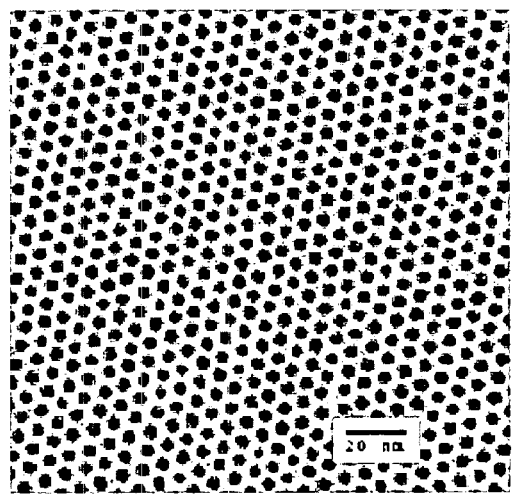
Fig. 7C

NANOPARTICLE SYNTHESIS AND THE FORMATION OF INKS THEREFROM

FIELD OF THE INVENTION

The present invention relates to nanoparticles. More specifically, the present invention relates to the synthesis of nanoparticles and related applications thereof.

BACKGROUND OF THE INVENTION

Ultra-fine particles or nanoparticle (particles having an average diameter of 200 nanometers or less) are believed to be useful in the fabrication of micro-electronic devices. Alivisatos et al., in U.S. Pat. No. 5,262,357, describe a method for making semi-conductor nanoparticles from metal precursors. Alivisatos et al. describe using these semi-conductor nanoparticles to make continuous semi-conductor films. Because the semi-conductor nanoparticles exhibit significantly lower melting temperature than bulk materials, a layer of the semi-conductor nanoparticle can be deposited on a substrate and annealed at relatively low temperatures, whereby the nanoparticles melt to form a continuous film.

One of the goals for nano-technology is to develop techniques and materials that will allow for the fabrication of micro-electronic devices on a variety of substrates using selective deposition, printing and/or imaging technologies. These selective deposition, printing and/or imaging technologies may utilize nanoparticle, or inks comprising nanoparticles, that can be used to fabricate micro-electronic devices at low temperatures and with high throughput.

To achieve the afore mentioned goal, it is necessary to develop new methods for making nanoparticles that can be used to fabricate continuous or patterned insulator layers, semi-conductor layers and conductive layers. To date, there has been limited ways to produce or make suitable metal nanoparticles having average particle sizes of 100 nanometers or less in high yield and with particle distribution size, which are suitable for inks to print micro-electronic devices and/or portions thereof. Previously disclosed methods for the synthesis of nanoparticles tend to be irreproducible, have low yields, produce particles with wide particles size distributions, produce particles with limited stability, produce particles which are insoluble in a suitable ink solvent or a combination thereof. Accordingly, there is a need for new methods of making metal nanoparticles for the fabrication of micro-electronic devices.

SUMMARY OF THE INVENTION

The present invention is directed to methods for making nanoparticles comprising metals and applications thereof. The nanoparticles of the present invention preferably have applications for formulating inks, which can be used in the fabrication of micro-electronic devices. Inks formulated with nanoparticles of the present invention can be deposited, printed or imaged onto a suitable substrate using any number of different techniques. For example, continuous films of nanoparticle inks can be deposited using slide bar coating, spin coating and ink jet coating techniques, to name a few. Continuous films of nanoparticle inks can then be cured and/or patterned using conventional lithographic techniques or other imaging techniques, such as those described in U.S. patent application Ser. No. 09/519,722, entitled "Method for Manufacturing Electronic and Electro Mechanical Elements and Device by Thin Film Deposition and Imaging", the contents of which are hereby incorporated by reference. Alternatively, films of nanoparticle inks can be patterned using gravure or embossing techniques, such as those described in U.S. patent application Ser. No. 09/525,734, entitled "Fabrication of Finely Features Devices by Liquid Embossing", the contents of which are also hereby incorporated by reference.

The nanoparticle inks formulated with the nanoparticles of the present invention can also be selectively deposited or printed to form patterned films using such techniques, such as ink-jet printing, micro-pipetting or any other selective deposition method. For example, nanoparticle inks can be selectively deposited using micro-stencil printing techniques. Micro-stencil printing techniques are described in U.S. patent application Ser. No. 10/007,122, entitled "Micro-Stencil", the contents of which are hereby incorporated by reference.

Regardless of the deposition or printing method chosen, what is needed are methods of making nanoparticle which result in nanoparticles that are sufficiently small to have low annealing or curing temperatures (less than 350 degrees Celsius) which can produce nanoparticles in high yield and which have high solubility in ink solvents. Further, what is needed are methods for formulating inks with sufficient concentrations, or loadings, of metal nanoparticles that conductive films can be formed. The present invention provides a versatile method for making nanoparticles comprising metals, wherein the nanoparticles can be made to be small (less than 100 nanometers), in high yield and with a range of particle size distributions suitable for the application at hand. Further, the method of the present invention can be used to make metal nanoparticles from a wide range of metal precursor and can be used to make mixtures or metal nanoparticles, alloy nanoparticles and metal core-shell nanoparticles.

In accordance with the embodiments of the invention, nanoparticles having an average diameter of 100 nanometers or less are formed by reducing a metal precursor in the presence of a reaction medium, that preferably comprises of one or more carboxylic acids and a hydrocarbon solvent. Reduction of the metal precursor in the above described reaction medium can be achieved by heating the mixture of the metal precursor and the reaction medium to a temperature sufficient to cause decomposition of the metal precursor. In an alternative embodiment, the reduction of the metal precursor in the above described reaction medium can be achieved by adding a suitable reducing agent to the mixture of the metal precursor and the reaction medium. Aldehydes are a preferred reducing agent. However, any number of other reducing agent are contemplated.

In accordance with the embodiments of the invention, a metal precursor preferably comprises of one or more metals selected from Ag, Pd, Rh, Cu, Pt, Ni, Fe, Ru, Os, Mn, Cr, Mo, Au, W, Co, Ir, Zn and Cd. Oxide metal precursors are considered to be particularly useful for the syntheses of metal nanoparticles, because they react with carboxylic acids to form the corresponding metal carboxylates, which are intermediates in the formation of nanoparticles, in situ giving water as a product of the reaction, which is readily removed during the isolation and purification of the nanoparticles.

In yet further embodiment of the invention, a second molecular metal precursor is combined with the reaction medium and reduced along with a first metal precursor, in the same or a separate step, to form mixtures of metal nanoparticles, alloy nanoparticles and/or metal core-shell nanoparticles.

The reaction medium preferably acts as a growth modifier to control the size of the metal nanoparticles formed and also to facilitate the reduction of the metal precursor(s) used. Preferably, the medium or solution comprises of one or more carboxylic acids (fatty acids) and a hydrocarbon solvent. In a preferred embodiment of the invention, the medium or solution comprises of 2-hexyldecanoic acid. In yet further embodiments of the invention, the medium or solution comprises of a mixture of carboxylic acids, such as a mixture of 2-hexyldecanoic acid and oleic acid or lauric acid and 2-ethylhexanoic acid. In yet further embodiments of the invention, the medium or solution comprises of other hydrocarbons such as 1-dodecene and/or surfactant and/or growth modifiers.

It appears that using a mixture of a branched and a linear carboxylic acids, such as 2-hexyldecanoic acid (branched) and oleic acid (linear), is important to controlling the size distribution and solubility of the nanoparticles. Spectroscopic data suggest that the acids are bound to the surface of the particles and act as growth modifies during the synthesis of the nanoparticles.

In accordance with the preferred embodiments of the invention, the metal nanoparticles are isolated and directly dissolved into a suitable ink solvent. The choice of solvent depends on the reaction conditions. For example, when the nanoparticles are synthesized with oleic acid and 2-hexyldecanoic acid, they tend to be directly soluble in non-polar solvents.

In accordance with an alternative embodiment of the invention, after the metal nanoparticles are formed, the metal nanoparticles are isolated from the medium or solution and treated with a surfactant to enhance their solubility in a suitable ink solvent. For example, metal nanoparticles are separate from the medium or solution by precipitating the nanoparticles. The metal nanoparticles are then treated with a surfactant, such as Ricinoleic acid, tetrahydro-2-furonic acid or any other suitable surfactant. The metal nanoparticles or the present invention can be made to be soluble in a number of different polar and non-polar solvents by judicious choice of the surfactant, or surfactants, used.

BRIEF DESCRIPTION OF THE DRAWINGS

FIG. 1 illustrates two reaction sequences for the reduction of metal precursors to form metal nanoparticles, in accordance with the invention.

FIGS. 7a–c are TEM images of silver nanoparticles isolated from the reduction of silver oxide, in accordance with the method of the present invention.

DETAILED DESCRIPTION OF A PREFERRED EMBODIMENT

Figure 2:
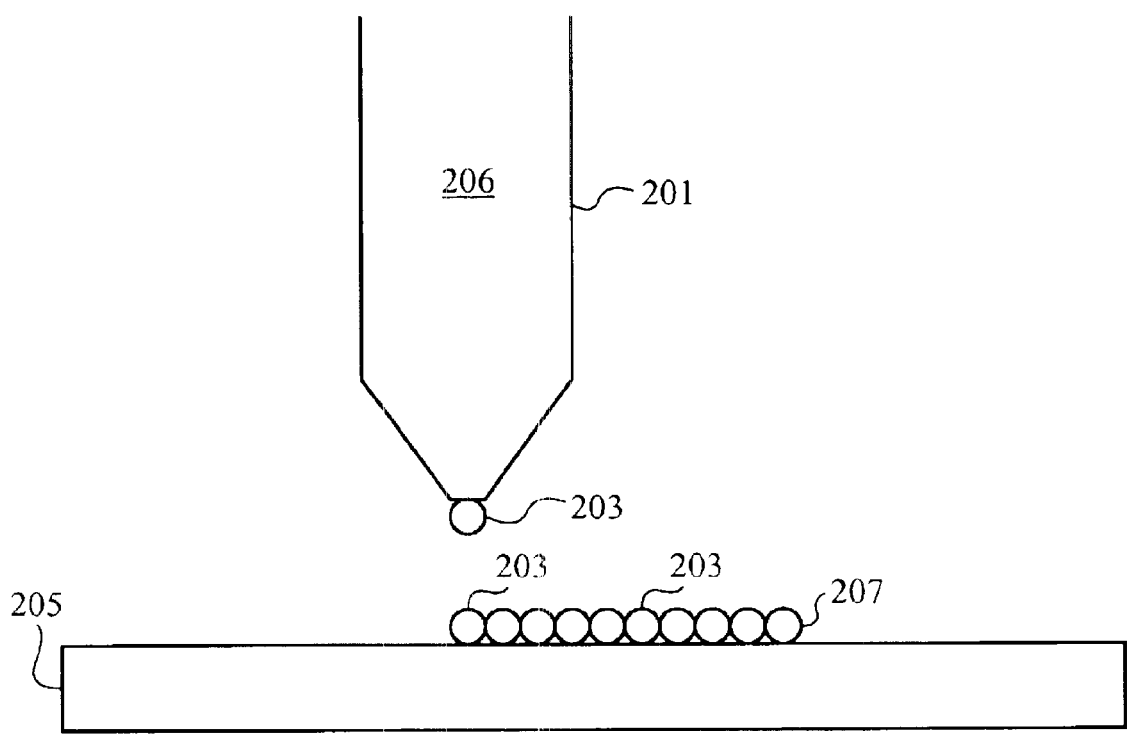
FIGS. 2 illustrates depositing a metal nanoparticle ink using a micro-pipette technique, in accordance with the invention.

FIG. 1 illustrates two reaction sequences for the reduction of metal precursors, in accordance with the preferred embodiment of the invention, a metal oxide precursor $M_xO_y$ is reduced to form nanoparticles, such as schematically shown in the reaction sequence (1). The metal oxide $M_xO_y$ precursor is any metal oxides including, but not limited to, oxides of Ag, Pd, Rh, Cu, Pt, Ni, Fe, Ru, Os, Mn, Cr, Mo, Au, W, Co, Ir, Zn and Cd. In accordance with the most preferred method of the present invention, the metal oxide, $M_xO_y$, is silver oxide. Oxides are particularly advantageous for the synthesis of metal nanoparticles, because they react with carboxylic acids to form metal carboxylic acid complexes in situ which are intermediates in the formation of nanoparticles. In addition, the metal oxide reacts with the carboxylic acid to give only water as a by-product, which can be easily removed upon isolation and purification of the nanoparticles. It is possible that in the reaction medium containing branched and/or linear carboxylic acids, a complex mixture of metal carboxylate complexes and clusters are formed that may in turn thermally decompose or be reduced to yield nanoparticles with the size distributions of choice.

Still referring to FIG. 1, in accordance with the embodiments of the present invention, a transition metal complex precursor $M(L)_x$ is reduced to form nanoparticles $M_n$, such as schematically shown in the reaction sequence (2). The transition metal complex precursor $M(L)_x$ is any transition metal complex, including, but not limited to, complexes of Ag, Pd, Rh, Cu, Pt, Ni, Fe, Ru, Os, Mn, Cr, Mo, Au, W, Co, Ir, Zn and Cd, which are complexed by a suitable ligand L. Suitable ligands include amines, phosphines, carbonyl groups, halides, nitrates, carboxylate, perchlorates, alkoxides and diketonates.

In accordance with the embodiments of the invention, a metal precursor, or precursors, such as a metal complex(s) $M(L)_x$, a metal oxide(s) $M_xO_y$ or a combination thereof, are mixed in a reaction medium. The reaction medium preferably comprises of one or more carboxylic acids or carboxylates, also referred to as fatty acids or fatty acid soaps. Preferably, the reaction medium comprises of 2-hexyldecanoic acid, oleic acid or combinations thereof. Other suitable carboxylic acids include acids with general formula RCO2H, where R is selected from the group of alkyl, alkenyl, alkynyl, branched and linear, such as, 2-ethylhexanoic acid, lauric acid, stearic acid, geranic acid, cyclohexyl propionic acid, 2-ethylcaproic acid, 3-cyclopentylpropionic acid, dimethylbutyric acid, octanoic acid, 5-dodecenoic acid, nonanoic acid and derivatives thereof. In a preferred embodiment of the invention, the reaction medium comprises a mixture of 2-hexyldecanoic acid and oleic acid with a molar ratio of 2-hexyldecanoic acid to oleic acid that is 4 to 1 or greater. In yet further embodiment of the invention, the reaction medium also comprises one or more hydrocarbon solvents such as 1-dodecene, 1-decene, 1-Octene and/or dodecane.

In accordance with an embodiment of the invention, a metal precursor is thermally reduced in the presence of the reaction medium by heating the mixture to an elevated temperature sufficient to cause decomposition of the metal precursor. In a further embodiment of the invention, a metal precursor is reduced in the presence of the reaction medium by adding a reducing agent to the mixture of the precursor and the reaction medium and heating to an elevated temperature sufficient to cause the reduction of the metal precursor. Typical temperatures required for thermal reduction of the metal precursors are above 150 degrees Celsius, but with the inclusion of a reducing agent, the metal precursor can be reduced to temperatures in the range of ambient to 400 C.

In accordance with a preferred embodiment of the invention, the reducing agent is an aldehyde. Aldehyde reducing agents which have been shown to be useful for making nanoparticle include octanal, dodecanal, paraformaldehyde and benzaldehyde. Other suitable reducing agents include alcohol reducing agents, such as 1-octanol, 3-octanol, ethanol, etc.; hydrazines reducing agents, such as hydrazine, dimethylhydrazine, 1-methyl-1-phenyl hydrazine, 1-aminopiperidine, etc.; amines reducing agents, such as (triethylamine); bi-functional reducing agents, such as alcohol amines; alcohol aldehydes, etc.; and inorganic reducing agents, such as cobaltacene. After the metal precursor, or precursors, are reduced to form metal nanoparticles, then the metal nanoparticles can be isolated from the reaction medium and formulated into a metal nanoparticle ink using surfactants and solvents, as described below.

Generally, metal nanoparticles can be isolated from the reaction medium by precipitation and centrifugation methods. For example, the nanoparticles are separated from the reaction medium by precipitating the nanoparticles with isopropanol. The mixture is then centrifuged and the nanoparticles are separated from the supernatant. It will be understood by one skilled in the art that the nanoparticles can be separated from the reaction medium using any number of separations techniques and that the nanoparticles can be precipitated, redissolved and washed any number of times to obtain high purity of the nanoparticles.

In accordance with the embodiments of the invention, after the nanoparticles are isolated from the reaction medium, the nanoparticles are dissolved directly into a suitable solvent to produce a nanoparticle ink suitable for depositing, printing or imaging onto or on a substrate. For example, when the nanoparticles are synthesized in 2-hexyldecanoic acid and oleic acid, the nanoparticles are directly soluble in cyclohexylbenzene, 2-ethylhexanol, 3-octanol, tetraline and toluene, presumably due to the surface bound carboxyl groups.

In accordance with alterative embodiments of the invention, after the nanoparticles are isolated form the reaction medium, then the nanoparticles are dispersed in a solvent, such as toluene, and treated with a surfactant to alter the solubility properties of the nanoparticles. For example, the nanoparticles are dissolved in toluene and treated with ricinoleic acid. The solution is stirred for 12 hr at 50° C. and the nanoparticles are again precipitated with a suitable solvent, such as methanol. The treated metal nanoparticles can now be dissolved in isopropanol to make a nanoparticle ink suitable for depositing, printing or imaging onto or on a substrate.

In another example, isolated metal nanoparticles are dissolved in 1 ml of hexane and tetrahydro-2-furoic acid is added to the mixture. The resulting two phase system (with a clear, colorless tetrahydro-2-furoic acid phase on the bottom, and a deep brown hexane phase on top) is shaken for 10 sec. and centrifuged. The resulting two phase system now has a colorless hexane phase and a brown tetrahydro-2-furoic acid phase. This color change indicates a migration of metal nanoparticles from hexane to the acid phase and is believed to involve a surfactant exchange on the particle surface. The acid phase in then separated and the metal nanoparticles are precipitated with toluene. The metal nanoparticle can then be dissolved in methanol to make a nanoparticle ink suitable for depositing, printing or imaging onto or on a substrate.

In accordance with further embodiments of the invention, prior to depositing, printing or imaging the nanoparticle ink onto a substrate, an adhesion and hardness promoter maybe added to the ink. Suitable adhesion promoters include metal complexes of Pd, Mg, W, Ni, Cr, Bi, B, Sn, In, Pt. In the preferred embodiments Pd carboxylates (0–10% wt.) are added to the ink to increase hardness and adhesion to substrates, such as, glass, silicon wafer, amorphous silicon, plastis, etc.

It has also been observed that prior to depositing, printing or imaging the nanoparticles ink onto a substrate, the substrate is preferably provided with a thin interface layer to help the adhesion of the cured ink and to improve morphologies of films produced therefrom. Compositions for and methods of making interface layers are described in U.S. patent application Ser. No. 10/226,903, filed Sep. 22, 2002, entitled "Interface Layer for the Fabrication of Electronic Devices", the contents of which are hereby incorporated by reference.

Nanoparticle inks can be made to have a high solubility in both non-polar and polar solvents, with metal loadings of 0–50 mass %, depending on the surfactant used. Additional surfactant(s) may be added to the nanoparticle ink formulation to adjust solubility, viscosity, wetting properties, etc. Other surfactants believed to be useful in the formulation of nanoparticles inks include Esters, betaines, ethers, polyethers, amineoxides and small chain carboxylic acids (i.e. not soaps).

The preferred ink formation will depend on the composition of the nanoparticles, the size of the nanoparticles, the surfactants used and the intended method of depositing, printing or imaging used. Suitable ink solvents include, Tetralin, cyclohexylbenzene, terpineols, 2-ethylhexanol, 3-octanol, indan, dimethylbenzene, gamma-butyrolactone, cyclohexanone, dihydrobenzofuran, decaline, 1-heptanol, 2-methyl-2,4-pentanediol, phenetylalcohol, citronellol, geraniol, diethyleneglycolmonoethylether, diethyleneglycolmonomethylether, phenetole, ethyllactate, diethylphthalate, diglyme, triglyme, tetraglyme, 3-octanol, cyclohexylbenzene, and mixtures thereof to name a few. FIGS. 2, 3, 4*a–c* and 5*a–c* will now be used to illustrate exemplary methods for depositing and/or printing metal nanoparticle inks, in accordance with the present invention.

FIG. 2 illustrates a method of depositing a metal nanoparticle ink 206 using a micro-pipette 201. In accordance with the embodiments of the invention, the metal nanoparticle ink 206 is deposited as droplets 203 onto a substrate 205 to form a image or pattern of 207 of droplets 203. This, or any other serail deposition, imaging or writing technique, such as ink-jet, can be used to deposit a continuous or patterned film of metal nanoparticles in onto a substrate 205.

Figure 3:
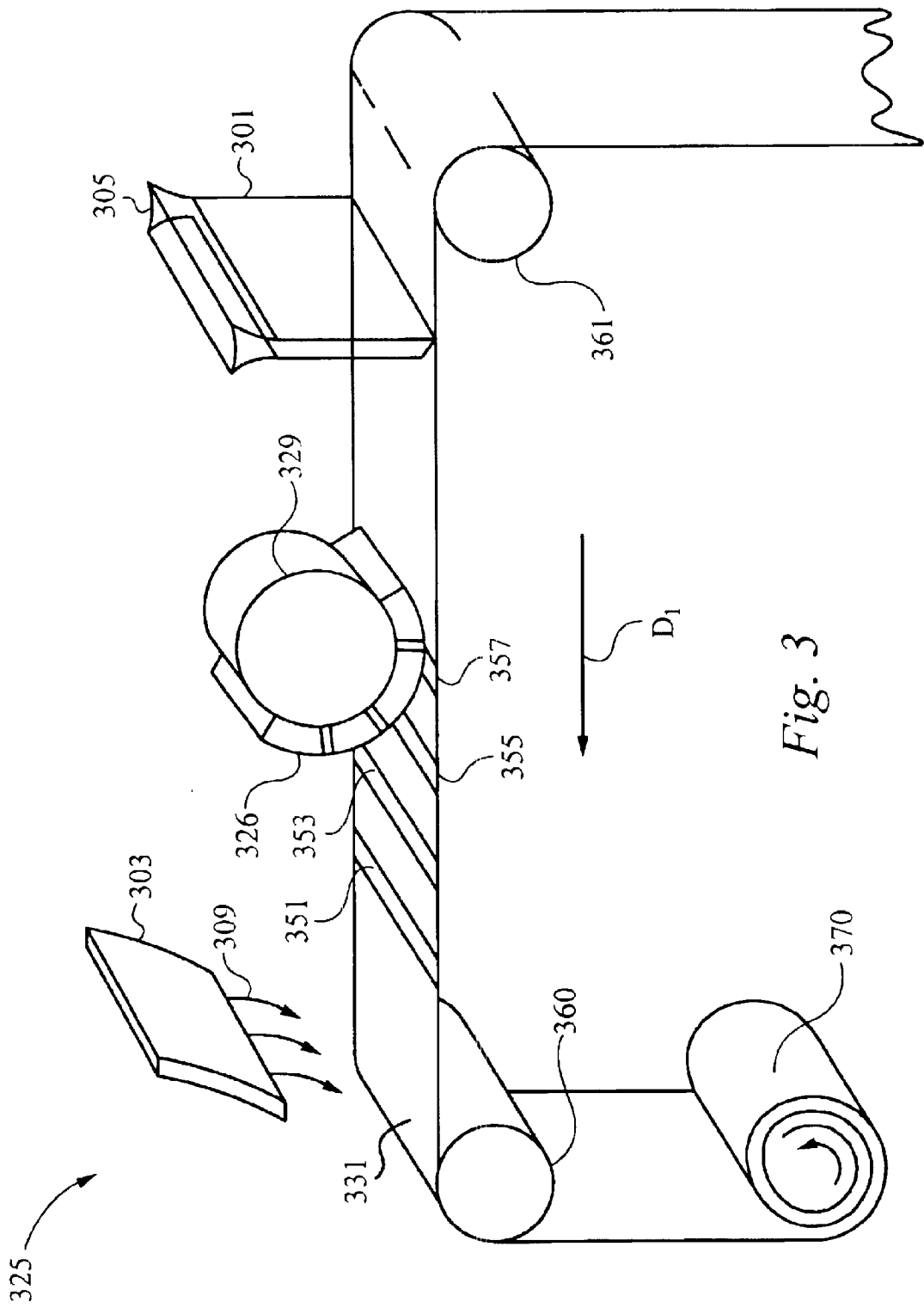
FIG. 3 illustrates slide coating a continuous film metal nanoparticle ink and patterning the film by an embossing technique, in accordance with the present invention.

FIG. 3 illustrates a system 325 which utilizes a slide coating bar 301 with an ink reservoir 305 for depositing a continuous film of metal nanoparticle ink onto a substrate 331. After the continuous film of metal nanoparticles ink is deposited onto the substrate 331, then the film is embossed with an embossing drum structure 329 comprising a patterned stamp head 326, wherein the embossing drum structure 329 rolls over the continuous film on the substrate 331 to print features 351, 353, 355 and 357 onto the film. The system 325 can be configured to move the substrate 331 in a direction $D_1$, such that the substrate 331 passes under a stationary or moving embossing drum structure 329. When the medium 331 is flexible, the system 325 can be configured with rollers 360 and 361 for controlling the direction, movement and/or tension of the substrate 331.

The system 325 can also be configured with a dryer 303 for curing and/or annealing the printed substrate 331 with an electron bean, photo energy or thermal energy 309 and an accumulator and/or winder 370 for controlling windup of the printed substrate 331. It will be clear to one skilled in the art that the system 325 can be equipped with any number of other features including, but not limited to, inspection stations, converting stations and alignment features.

Figure 4A:
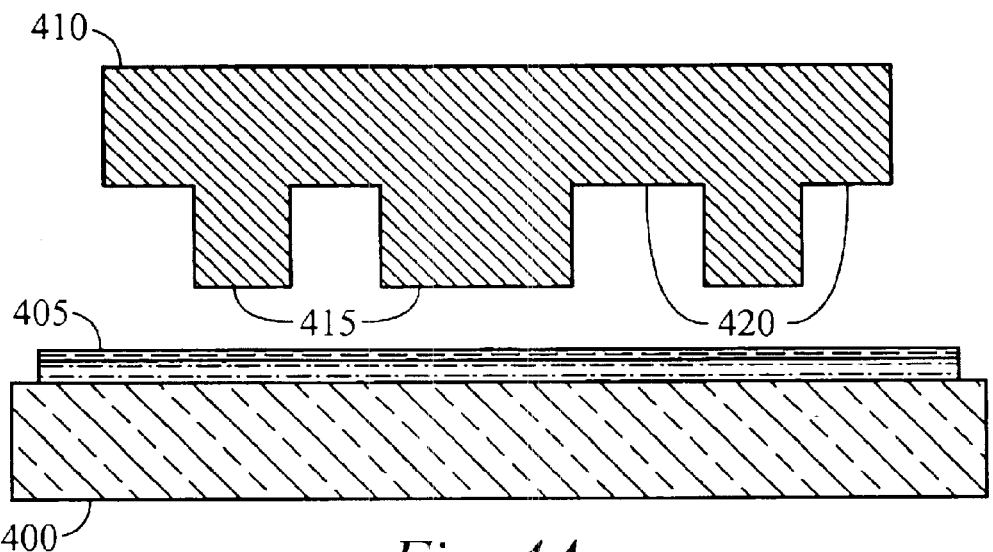
FIGS. 4a–c illustrate patterning a continuous layer of metal nanoparticle ink using a liquid embossing technique, in accordance with the invention.
Figure 4B:
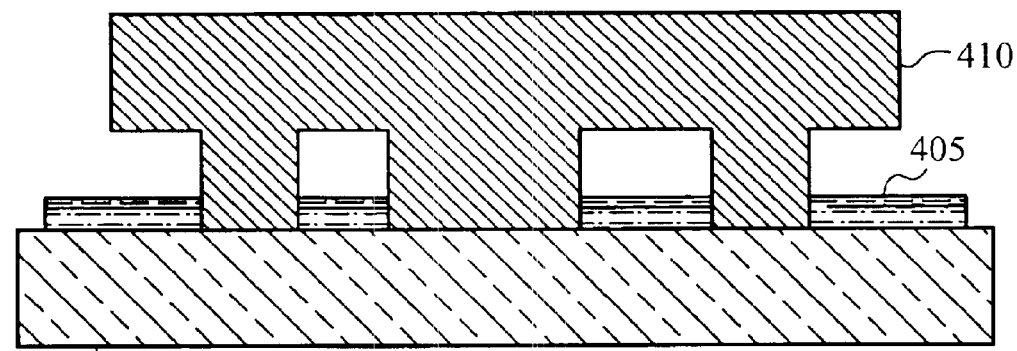
Figure 4C:
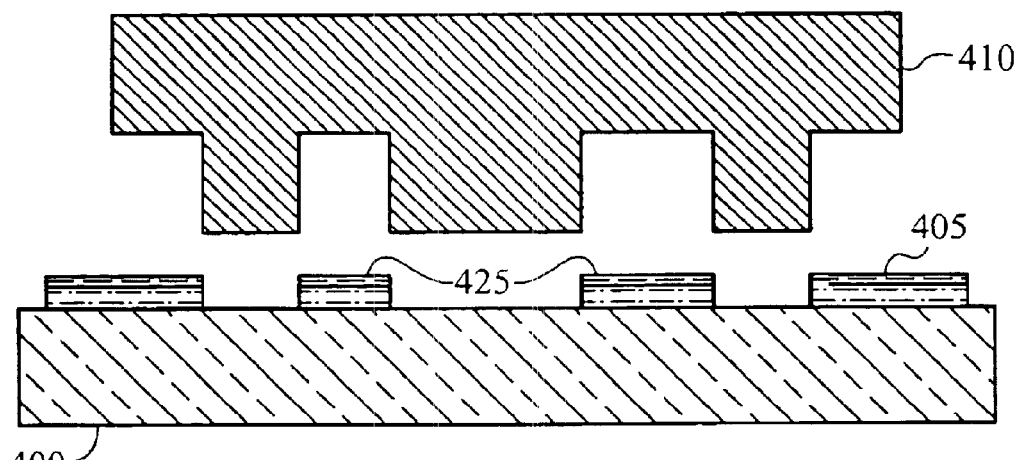

FIGS. 4a–c illustrate forming a patterned layer from a continuous layer of metal nanoparticle ink using a liquid embossing technique. In accordance with the embodiments of the invention, a substrate 400 is coated with a thin film of metal nanoparticle ink 405 such a shown in FIG. 4a. The layer 405 can be formed or deposited onto the substrate 400 using any suitable techniques including, but not limited to, slide coating, ink-jet coating and spin coating.

After the substrate 400 is provided with the thin film of metal nanoparticle ink 405, then an elastomeric stamp 410 having a pattern of projecting features 415 and recessed features 420 is lowered until the projecting features 415 make contact with substrate 400, thereby displacing metal nanoparticle ink 405 at the regions of contact, such as shown in FIG. 4b.

After the layer or metal nanoparticle ink 405 is patterned, then the stamp 410 is removed from the substrate 400 resulting in the patterned features 425, in the film 405. The patterned film 415 can then be cured, or alternatively cured while the stamp 410 is in contact with the substrate 410. Further details of stamps and methods of liquid embossing are described in the U.S. patent application Ser. No. 09/525,734, entitled "Fabrication of Finely Features Devices by Liquid Embossing", referenced previously.

Figure 5A:
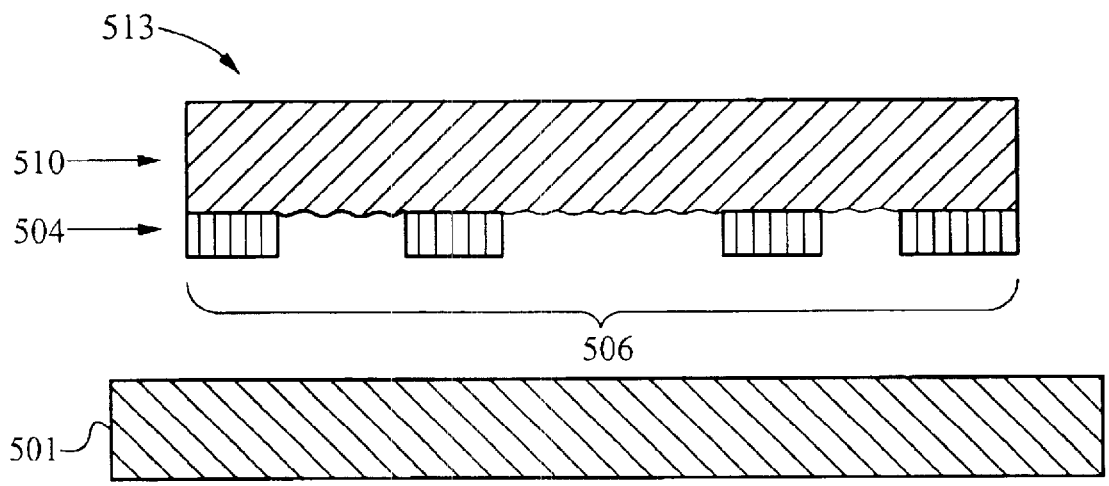
FIGS. 5a–c illustrate forming a patterned layer of a metal nanoparticle ink using a micro-stenciling technique, in accordance with the invention.
Figure 5B:
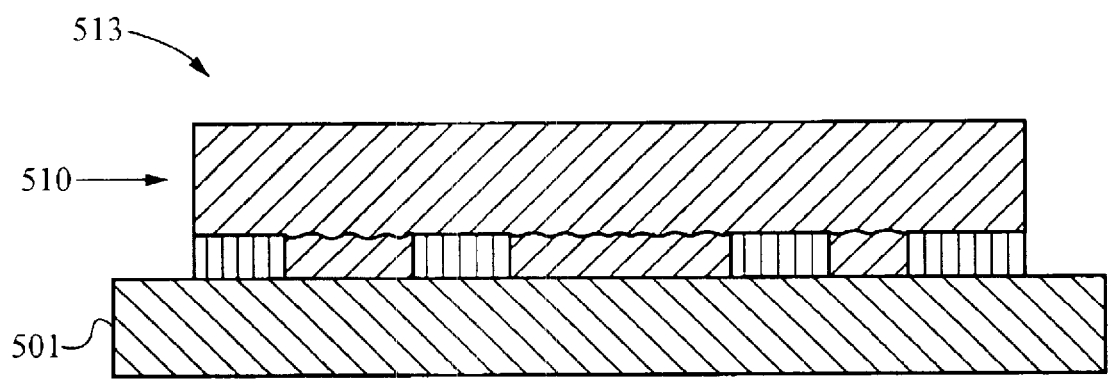

FIG. 5a–b illustrate forming a patterned layer with metal nanoparticle ink using a micro-stencil techniques. In accordance with the embodiments of the invention, a micro-stencil 513 comprises a patterned membrane 504 and a metal nanoparticle ink supply 510. The ink supply, preferably comprises a porous structure or membrane, which allows ink to flow to the print surface 506 of the micro-stencil 513.

To form a patterned layer of metal nanoparticle ink, the substrate 501 and the print surface 506 of the micro-stencil 513 are brought together, such that ink is directly transferred onto the substrate 501 through the membrane 504, as shown in FIG. 5b.

Figure 5C:
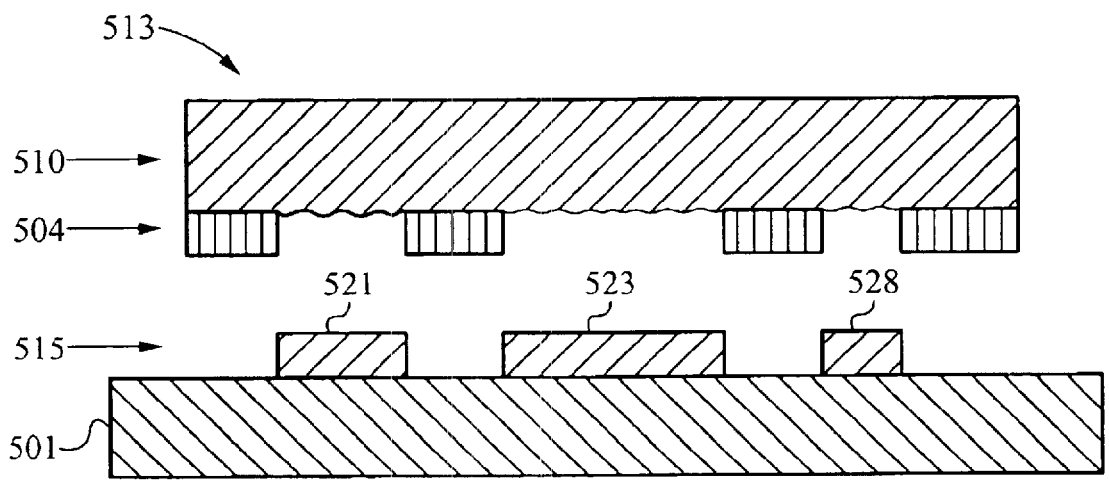

After the substrate 501 and the print surface 506 are brought together, then the micro-stencil 513 and the substrate 501 are separated leaving a patterned print layer 515 with print features 521, 523 and 525, such as shown in FIG. 5c. The print layer 515 can then be cured, or alternatively cured while the micro-stencil 513 is in contact with the substrate 501. Addition details of micro-stencils and uses thereof are described in U.S. patent application Ser. No. 10/007,122, entitled "Micro-Stencil", referenced previously.

Regardless of the deposition and/or printing method used, curing metal nanoparticle films typical involves the removal of solvent and/or surfactant. Cured films can be produced which exhibit conductivities in a range of 0–100% of that of bulk metal. Cured films preferably have thicknesses in a range of about 1.0 nanometers to about 1000 nanometers and have compositions that correspond to 80% metal or greater.

Figure 6A:
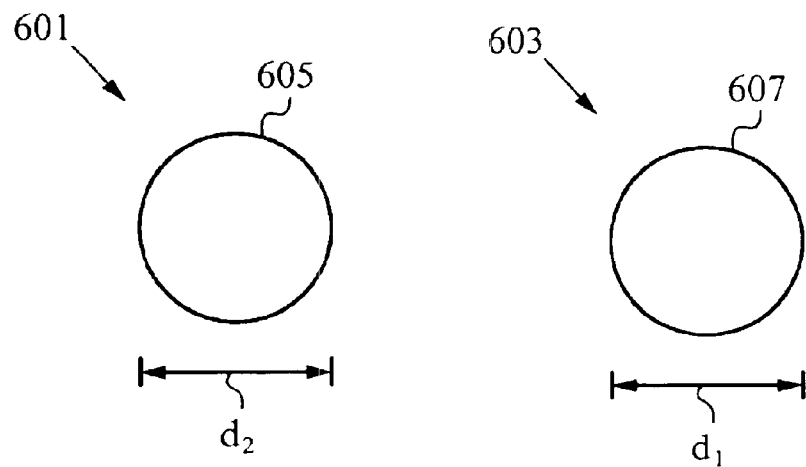
FIGS. 6a–c show schematic representations a mixture of metal nanoparticles, an alloy nanoparticle and a metal core-shell nanoparticle, respectively.
Figure 6B:
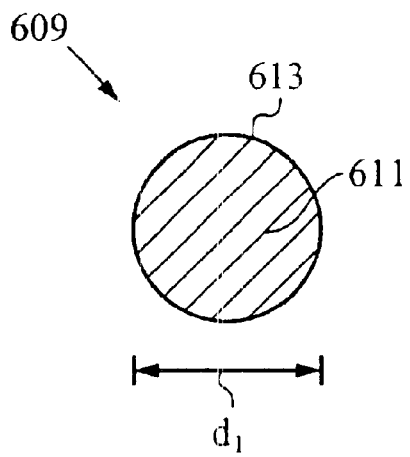
Figure 6C:
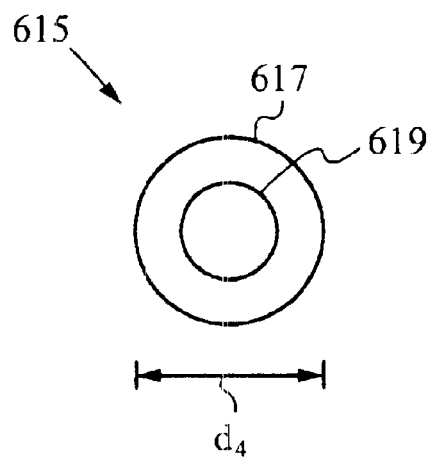

FIGS. 6a–c show schematic representations mixtures of metal nanoparticles, an alloy nanoparticle and a core-shell nanoparticle, respectively. Referring to FIG. 6a, in accordance with the embodiments of the present invention, metal nanoparticles 601 and 603, comprising a first composition 605 and a second composition 607, can be formed in a single synthesis. For example, a reaction mixture is formulated with a first metal precursor that is subject to thermal reduction and a second metal precursor that is thermally stable relative to the first metal precursor, but which can be readily reduced chemically. Accordingly, the reaction mixture can be thermally treated to reduce the first metal precursor and form the metal nanoparticles 601 having the first composition 605. Then a reducing agent can be added to the reaction mixture to reduce the second metal precursor and form nanoparticles 603 having the second composition 607. Preferably, the average diameters $D_1$ and $D_2$ of the nanoparticles formed are 100 nanometers or less.

Referring to FIG. 6b, in accordance with further embodiments of the invention, nanoparticles 609 are formed having an alloy composition comprising a first metal 611 and a second metal 613. For example, a reaction mixtures can be formulated with a first metal precursor comprise the first metal 611 and a second metal precursor comprising the second metal 613, wherein the first metal precursor and the second metal precursor are simultaneously reduced and metal atoms aggregate during the reaction to form the alloy nanoparticles 609. Preferably, the average diameter of the alloy nanoparticles 609 are 100 nanometers or less.

Referring to FIG. 6c, in yet further embodiments of the invention, metal core-shell nanoparticles 615 are synthesized, wherein the nanoparticle 615 comprise a core 619 comprising a first metal and a shell comprising a second metal. Metal core-shell nanoparticle can be synthesized by selective reduction of a first metal precursor comprising the first metal and a second metal precursor comprising the second metal, such as described above and below. Whether, distributions of metal nanoparticles (FIG. 6a), metal alloy nanoparticles (FIG. 6b), metal core-shell nanoparticles (FIG. 6c) or any combination thereof, are formed depends on the particular reaction condition chosen and the metal precursors used. Below several examples of nanoparticle syntheses are described, using thermal reduction of metal precursors, chemical reduction of metal precursors and reduction of mixtures of metal precursors, as described above.

EXAMPLES

A. Synthesis of Metal Nanoparticles by Reduction of Metal Precursors

Example I

Synthesis 87 mg Ag2O (0.38 mmol) are dissolved in a mixture of 1.92 g 2-hexyldecanoic acid (7.5 mmol) and 1.51 g 1-dodecene at room temperature. 0.42 g oleic acid (1.5 mmol) is added. The mixture is stirred at room temperature under N2 flow for about 10 minutes. The reaction mixture is heated up to 150° C. and 0.33 ml dodecanal (1.5 mmol) are injected with a syringe into the reaction mixture. The reaction mixture is stirred at 150° C. under N2 for 90 minutes. The reaction is then rapidly cooled down to room temperature.

(Reaction volume=5 ml; [Ag]=0.15M; Ag/2-hexyldecanoic acid=1:10; Ag/oleic acid=1:2; Ag/dodecanal=1:2).

Isolation of Particles 10 ml isopropanol are added to the reaction mixture to precipitate the Ag nanoparticles. The precipitate is separated from the supernatant by centrifuging. The precipitate is re-dissolved in 1 ml toluene. 2 ml isopropanol are then added to this solution. The so purified Ag nanoparticles are obtained as precipitate by centrifuging and then dried for 12 hours under N2 flow. The yield of the nanoparticles was 96% based on silver.

Example II

Synthesis 58 mg Ag2O (0.25 mmol) are dissolved in a mixture of 1.28 g 2-hexyldecanoic acid (5 mmol) and 1.62 g 1-dodecene at room temperature. 0.28 g oleic acid (1 mmol) is added. The mixture is stirred at room temperature under N2 flow for about 10 minutes. The reaction mixture is then heated to 130° C. 0.16 ml octanal (1 mmol)/in 0.70 g of 1-dodecene is injected with a syringe into the reaction mixture. The reaction mixture is stirred at 130° C. under N2 for 180 minutes. The reaction is rapidly cooled down to room temperature. (Reaction volume: 5 ml; [Ag]=1.0M; Ag/2-hexyldecanoic acid=1:10; Ag/oleic acid=1:2; Ag/octanal=1:2).

Isolation of Particles 40 ml isopropanol are added to the reaction mixture to precipitate the Ag nanoparticles. The precipitate is separated from the supernatant by centrifuging. The precipitate is re-dissolved in 0.5 ml toluene. 4 ml isopropanol are added to this solution. The so purified Ag nanoparticles are obtained as precipitate by centrifuging and then dried for 12 hours under N2 flow.

Example III

Synthesis 58 mg Ag2O (0.25 mmol) are dissolved in a mixture of 1.28 g 2-hexyldecanoic acid (5 mmol) and 2.68 g 1-dodecene at room temperature. The mixture is stirred at room temperature under N2 flow for about 10 minutes. The reaction mixture is heated up to 150° C. 0.22 ml dodecanal (1 mmol)/in 0.68 g of 1-dodecene is injected with a syringe into the reaction mixture. The reaction mixture is stirred at 150° C. under N2 for 19 minutes. The reaction is then rapidly cooled down to room temperature. (Reaction volume: 5 ml; [Ag]=0.1M; Ag/2-hexyldecanoic acid=1:10; Ag/dodecanal=1:2).

Isolation of Particles 40 ml isopropanol are added to the reaction mixture to precipitate the Ag nanoparticles. The precipitate is separated from the supernatant by centrifuging. The precipitate is re-dissolved in 0.5 ml toluene. 4 ml isopropanol are added to this solution. The so purified Ag nanoparticles are obtained as precipitate by centrifuging and then dried for 12 hours under N2 flow.

Example IV

Synthesis 130 mg Ag(ethylhexanoate) (0.50 mmol) are dissolved in 0.50 ml of triethyl amine. This solution was injected into a mixture at 80 C- of 2.06 g 1-dodecene, 1.28 g of 2-hexyldecanoic acid and 0.28 g of oleic acid. The reaction is stirred at 80° C. for 2 hr under N2. The reaction is then rapidly cooled down to room temperature. (Reaction volume: 5 ml; [Ag]=0.1M; Ag/2-hexyldecanoic acid=1:10; Ag/oleic acid=1:2, Ag/triethyl amine=1:2).

Isolation of Particles 40 ml isopropanol are added to the reaction mixture to precipitate the Ag nanoparticles. The precipitate is separated from the supernatant by centrifuging. The precipitate is redissolved in 0.5 ml toluene. 4 ml isopropanol are added to this solution. The so purified Ag nanoparticles are obtained as precipitate by centrifuging and then dried for 12 hours under N2 flow.

Example V

Synthesis 58 mg Ag2O (0.25 mmol) are dissolved in a mixture of 0.64 g 2-hexyldecanoic acid (5 mmol) and 3.17 g 1-dodecene and 0.08 ml octanol (0.5 mmol) at room temperature. The reaction mixture is stirred at 100° C. for 3 hours. The reaction is then rapidly cooled down to room temperature. (Reaction volume: 5 ml; [Ag]=0.1M; Ag/2-hexyldecanoic acid=1:5; Ag/octanol=1:1).

Isolation of Particles 10 ml isopropanol are added to the reaction mixture to precipitate the Ag nanoparticles. The precipitate is separated from the supernatant by centrifuging. The precipitate is re-dissolved in 1 ml toluene. 2 ml isopropanol are then added to this solution. The so purified Ag nanoparticles are obtained as precipitate by centrifuging and then dried for 12 hours under N2 flow.

B. Synthesis of Metal Nanoparticles by Thermal Decomposition of Metal Precursors

Example I

Synthesis 58 mg Ag2O (0.25 mmol) are dissolved in a mixture of 1.28 g 2-hexyldecanoic acid (5 mmol) and 1.48 g 1-dodecene at room temperature. 1.41 g oleic acid (5 mmol) is added. The reaction mixture is stirred at 200° C. for 180 minutes, and then rapidly cooled down to room temperature. (Reaction volume: 5 ml; [Ag]=0.1M; Ag/2-hexyldecanoic acid=1:10; Ag/oleic acid=1:2).

Isolation of Particles 40 ml isopropanol are added to the reaction mixture to precipitate the Ag nanoparticles. The precipitate is separated from the supernatant by centrifuging. The precipitate is re-dissolved in 0.5 ml toluene. 4 ml isopropanol are added to this solution. The so purified Ag nanoparticles are obtained as precipitate by centrifuging and then dried for 12 hours under N2 flow.

Example II

Synthesis 58 mg Ag2O (0.25 mmol) are dissolved in a mixture of 1.28 g 2-hexyldecanoic acid (5 mmol) and 2.68 g 1-dodecene at room temperature. The reaction mixture is heated up to 170° C. and stirred for 20 minutes. The reaction mixture is then rapidly cooled down to room temperature. (Reaction volume: 5 ml; [Ag]=0.1M; Ag/2-hexyldecanoic acid=1:10).

Isolation of Particles 10 ml isopropanol are added to the reaction mixture to precipitate the Ag nanoparticles. The precipitate is separated from the supernatant by centrifuging. The precipitate is re-dissolved in 1 ml toluene. 3 ml isopropanol are added to this solution. The so purified Ag nanoparticles are obtained as precipitate by centrifuging and then dried for 12 hours under N2 flow.

Example III

Synthesis 130 mg Ag(ethylhexanoate) (0.50 mmol) in 3.26 g 1-dodecene and 1.30 g of 2-hexyl decanoic acid. The reaction is stirred at 200° C. for 11 min. The reaction is then rapidly cooled down to room temperature. (Reaction volume: 5 ml; [Ag]=0.1M; Ag/2-hexyldecanoic acid=1:10).

Isolation of Particles 40 ml isopropanol are added to the reaction mixture to precipitate the Ag nanoparticles. The precipitate is separated from the supernatant by centrifuging. The precipitate is re-dissolved in 0.5 ml toluene. 4 ml isopropanol are added to this solution. The so purified Ag nanoparticles are obtained as precipitate by centrifuging and then dried for 12 hours under N2 flow. TEM=6.1 nm 0.95 std. Mean particle size.

Example IV

Synthesis 130 mg Ag(ethylhexanoate) (0.50 mmol) in 3.26 g 1-dodecene and 1.30 g of 2-ethylhexanoic acid. The reaction is stirred at 200° C. for 11 min. The reaction is then rapidly cooled down to room temperature. (Reaction volume: 5 ml; [Ag]=0.1M; Ag/2-hexyldecanoic acid=1:10).

Isolation of Particles 40 ml isopropanol are added to the reaction mixture to precipitate the Ag nanoparticles. The precipitate is separated from the supernatant by centrifuging. The precipitate is re-dissolved in 0.5 ml toluene. 4 ml isopropanol are added to this solution. The so purified Ag nanoparticles are obtained as precipitate by centrifuging and then dried for 12 hours under N2 flow.

Synthesis 76 mg Pd(propionate)2(0.3 mmol) are dissolved in 2.0 ml of toluene. 0.77 g of 2-hexyldecanoic acid (3 mmol) and 0.17 g of oleic acid (0.6 mmol) are added at room temperature. The reaction mixture is stirred at 100° C. for 16 minutes, and then rapidly cooled down to room temperature. (Reaction volume: 3 ml; [Pd]=0.1M; Pd/2-hexyldecanoic acid=1:10; Pd/oleic acid=1:2).

Isolation of Particles

3–6 ml methanol are added to the reaction mixture to precipitate the Pd nanoparticles. The precipitate is separated from the supernatant by centrifuging. The precipitate is re-dissolved in 0.5 ml toluene. 4 ml methanol are added to this solution. The so purified Pd nanoparticles are obtained as precipitate by centrifuging and then dried for 12 hours under N2 flow.

C. Synthesis of Metal Alloy Nanoparticles

Example I

Synthesis 58 mg Ag2O (0.25 mmol) is dissolved in a mixture of 1.28 g 2-hexyldecanoic acid (5 mmol) and 2 ml 1-dodecene at room temperature. 0.28 g oleic acid (1 mmol) and 0.22 ml dodecanal (1 mmol) are added. This mixture is stirred at room temperature under N2 flow for about 10 minutes. The reaction mixture is heated up to 150° C. and a solution of 6 mg Pd(propionate) (0.02 mmol) in 1 ml 1-dodecene is injected with a syringe into the reaction mixture. The reaction mixture is stirred at 150° C. under N2 for 15 minutes. The reaction is then rapidly cooled down to room temperature. (Reaction volume=5 ml; [Ag]=0.1M; Ag/2-hexyldecanoic acid=1:10; Ag/oleic acid=1:2; Ag/dodecanal=1:2, Pd-propionate/Ag=1:20).

Isolation of Particles 20 ml isopropanol are added to the reaction mixture to precipitate the Ag/Pd-alloy nanoparticles. The precipitate is separated from the supernatant by centrifuging. The precipitate is re-dissolved in 1 ml toluene. 4 ml isopropanol are then added to this solution. The so purified Ag/Pd-alloy nanoparticles are obtained as precipitate by centrifuging and then dried for 12 hours under N2 flow. Elemental Analysis showed the particles to contain 72% Ag and 1.2% Pd.

Example II

Synthesis 58 mg Ag2O (0.25 mmol) are dissolved in a mixture of 1.28 g 2-hexyldecanoic acid (5 mmol) and 2 ml 1-dodecene at room temperature. 0.28 g oleic acid (1 mmol) and 0.22 ml dodecanal (1 mmol) are added. This mixture is stirred at room temperature under N2 flow for about 10 minutes. The reaction mixture is heated up to 150° C. and a solution of 6 mg Pd(propionate) (0.02 mmol) in 1 ml 1-dodecene is injected with a syringe into the reaction mixture. The reaction mixture is stirred at 150° C. under N2 for 15 minutes. The reaction is then rapidly cooled down to room temperature.

(Reaction volume=5 ml; [Ag]=0.1M; Ag/2-hexyldecanoic acid=1:10; Ag/oleic acid=1:2; Ag/dodecanal=1:2, Pd-propionate/Ag=1:20).

Isolation of Particles 20 ml isopropanol are added to the reaction mixture to precipitate the Ag nanoparticles. The precipitate is separated from the supernatant by centrifuging. The precipitate is re-dissolved in 1 ml toluene. 4 ml isopropanol are then added to this solution. The so purified Ag nanoparticles are obtained as precipitate by centrifuging and then dried for 12 hours under N2 flow.

FIGS. 7a–c are TEM images of silver nanoparticle isolated from the reduction of silver oxide, in accordance with the method of the present invention. Specifically, FIGS. 7a, 7b and 7c correspond to metal nanoparticles isolated from Examples I, II and III described under Synthesis of Metal Nanoparticles by Reduction of Metal Precursors, above.

Referring to FIG. 7a, the TEM shows that the metal nanoparticles isolated from the reaction are monodispersed with an average particle size of approximately 4.1 nanometers and with a standard deviation of approximately 5.3 percent. Referring to FIG. 7b, the TEM shows that the metal nanoparticles isolated from the reaction are monodispersed with an average particle size of approximately 6.0 nanometers and with standard deviation of approximately 8.3 percent. Referring to FIG. 7c, the TEM shows that the metal nanoparticles isolated from the reaction have average particle sizes of approximately 7.1 nanometers with a standard deviation of approximately 8.5 percent. Other results have shown that metal nanoparticles can be synthesized having a wide range of sizes, typically in the range of about 1 to about 20 nanometers and with a range of different particle size distributions depending on the reaction conditions and the metal precursor(s) used.

The method of the present invention provides a versatile method to synthesis metal nanoparticles using a range of metal precursors. Nanoparticles inks formulated using the metal nanoparticle synthesized, in accordance with the present invention, have curing temperatures typically below 300° C. and result in films with conductivities ranging form 0 to 100 percent of bulk metals. In accordance with the present invention, nanoparticles can be synthesized with a high degree of purity and inks can be formulated with a high degree of metal loading.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention. Specifically, reactive metal nanoparticle inks can be formulated by the inclusion of thermal and/or photo promoters, which allow the inks to be cured at even lower temperatures. Further, while the metal nanoparticles of the present invention, and the inks formulated therefrom, are preferably capable of being used to form conductive layers for micro-electronics, the metal nanoparticles of the present invention, and the inks formulated therefrom, are not limited to the formation of conductive layers.

What is claimed is:

1. A method of making nanoparticles comprising:
    a. combining a first molecular metal precursor with a reaction medium, wherein the reaction medium comprises a plurality of carboxylate moieties; and
    b. adding an aldehyde to the metal precursor and the reaction medium to form the nanoparticles.

2. The method of claim 1, wherein the molecular metal precursor is a metal oxide.

3. The method of claim 2, wherein the metal oxide is silver-oxide.

4. The method of claim 1, wherein the molecular metal precursor comprises a metal selected from the group consisting of Ag, Pd, Rh, Cu, Pt, Ni, Fe, Ru, Os, Mn, Cr, Mo, Au, W, Co, Ir, Zn and Cd.

5. The method of claim 1, wherein reaction medium comprises carboxylic acid.

6. The method of claim 5, wherein the carboxylic acid includes at least one of 2-hexyldecanoic acid and 2-ethylhexanoic acid.

7. The method of claim 1, wherein the reaction medium further comprises a hydrocarbon and a carboxylic acid selected from the group consisting of dodecene and oleic acid.

8. The method of claim 1, wherein the reaction medium comprises a mixture of two or more of 2-hexyldecanoic acid, 2-ethylhexanoic acid and oleic acid.

9. The method of claim 1, further comprising heating the metal precursor and the reaction medium in the presence of the aldehyde.

10. The method of claim 1, wherein the aldehyde is selected from the group consisting of octanal, dodecanal, paraformaldehyde and benzaldehyde.

11. The method of claim 1, wherein the nanoparticles formed have an average diameter of 100 nanometers or less.

12. The method of claim 1, wherein the molecular metal precursor comprises a mixture of metals and wherein the nanoparticles formed comprises the mixture of the metals.

13. The method of claim 1, further comprising combining a second molecular metal precursor with a reaction medium to form nanoparticles comprising a core of metal from the first molecular metal precursor and a shell of metal from the second molecular metal precursor.

14. The method of claim 1, further comprising isolating the nanoparticles from the reaction medium and treating the nanoparticles with a surfactant.

15. The method of claim 14, wherein the surfactant is a surfactant selected from the group consisting of Ricinoleic acid and tetrahydro-2-furonic acid.

16. A method of making nanoparticles comprising:
    a. reducing a first metal precursor in the presence of a reaction medium to form the nanoparticles, wherein the reaction medium comprises a plurality of carboxylate moieties; and
    b. isolating the nanoparticles from the reaction medium.

17. The method of claim 16, further comprising treating the nanoparticles with a surfactant.

18. The method of claim 17, wherein the surfactant is a surfactant selected from the group consisting of Ricinoleic acid and tetrahydro-2-furonic acid.

19. The method of claim 16, wherein the first metal precursor comprises a metal selected from the group consisting of Ag, Pd, Rh, Cu, Pt, Ni, Fe, Ru, Os, Mn, Cr, Mo, W, Co, Ir, Zn and Cd.

20. The method of claim 16, wherein reducing comprises heating the first metal precursor in the presence of the reaction medium.

21. The method of claim 16, wherein reducing comprises adding a reducing agent to the first metal precursor in the presence of the reaction medium.

22. The method of claim 21, wherein the reducing agent is an aldehyde.

23. The method of claim 22, wherein the aldehyde is selected from the group consisting of octanal, dodecanal, paraformaldehyde and benzaldehyde.

24. The method of claim 16, wherein the reaction medium comprises carboxylic acid.

25. The method of claim 24, wherein the carboxylic acid includes at least one of 2-hexyldecanoic acid and 2-ethylhexanoic acid.

26. The method of claim 25, wherein the reaction medium further comprises a hydrocarbon solvent and a carboxylic acid selected from the group consisting of dodecene and oleic acid.

27. The method of claim 16, wherein the first metal precursor is silver-oxide.

28. The method of claim 16, wherein the reaction medium comprises a mixture comprising of two more of 2-hexyldecanoic acid, 2-ethylhexanoic acid and oleic acid.

29. The method of claim 16, further comprising reducing a second metal precursor in the presence of the reaction medium.

30. The method of claim 29, wherein the first metal precursor is silver oxide and the second metal precursor comprises a metal selected from the group consisting of Pd, Rh, Cu, Pt, Ni, Fe, Ru, Os, Mn, Cr, Mo, Au, W, Co, Ir, Zn and Cd.

31. A method of synthesizing nanoparticles from a metal precursor comprising:
    a. forming a growth modifier solution comprising a plurality of carboxylate moieties; and
    b. reducing the metal precursor in the presence of the growth modifier solution to generated the nanoparticles, wherein the nanoparticles have an average diameter of 100 nanometers or less.

32. The method of claim 31, wherein reducing comprises heating the metal precursor in the presence of the growth modifier solution.

33. The method of claim 31, wherein reducing comprises adding a reducing agent to the metal precursor in the presence of the growth modifier solution.

34. The method of claim 33, wherein the reducing agent is an aldehyde.

35. The method of claim 34, wherein the aldehyde is selected from the group consisting of octanal, dodecanal, paraformaldehyde and benzaldehyde.

36. The method of claim 31, wherein the plurality of carboxylate moieties comprises one or more of 2-hexyldecanoic acid and 2-ethylhexanoic acid.

37. The method of claim 36, wherein the plurality of carboxylate moieties further comprises oleic acid.

38. The method of claim 31, wherein the metal precursor comprise a metal oxide.

39. The method of claim 38, wherein the metal oxide is silver oxide.

40. The method of claim 31, wherein the metal precursor comprises a metal selected from the group consisting of Ag, Pd, Rh, Cu, Pt, Ni, Fe, Ru, Os, Mn, Cr, Mo, Au, W, Co, Ir, Zn and Cd.

41. The method of claim 31, further comprising isolating the nanoparticles from the growth modifier solution and treating the nanoparticles with a surfactant.

42. The method of claim 41, wherein the surfactant is selected from the group consisting of Ricinoleic acid and tetrahydro-2-furonic acid.

43. A method of making nanoparticles comprising silver, the method comprising:

a. forming a mixture of silver oxide in a solution comprising of one or more carboxylic acids and a hydrocarbon solvent; and b. reducing the silver oxide in the presence of the one or more carboxylic acids and a hydrocarbon solvent.

44. The method of claim 43, wherein the one or more carboxylic acids comprise 2-hexyldecanoic acid or 2-ethylhexanoic acid.

45. The method of claim 44, wherein the one or more carboxylic acids further comprises oleic acid.

46. The method of claim 43, wherein reducing the silver oxide comprises adding an aldehyde to the solution.

47. The method of claim 46, wherein the aldehyde is selected from the group consisting of octanal, dodecanal, paraformaldehyde and benzaldehyde.

48. The method of claim 43, further comprising simultaneously reducing a transition metal coordination complex along with the silver oxide.

49. A method of making a nanoparticle ink comprising:

a. reducing a first metal precursor in the presence of a reaction medium to form nanoparticles, wherein the reaction medium comprises a plurality of carboxylate moieties;

b. isolating the nanoparticles from the reaction medium; and c. dispersing the nanoparticles in a solvent medium.

50. The method of claim 49, herein the solvent medium includes one or more solvents selected from the group consisting of cyclohexylbenzene, 2-ethylhexanol, 3-octanol, tetraline and toluene.

51. The method or claim 49, further comprising treating the nanoparticles with a surfactant.

52. The method of claim 51, wherein the surfactant is selected from the group consisting of Ricinoleic acid and tetrahydro-2-furonic acid.

53. The method of claim 49, wherein the solvent medium includes one or more surfactants selected from the group consisting of esters, betaines, ethers, polyethers, amineoxides and small chain carboxylic acids.

* * * * *

UNITED STATES PATENT AND TRADEMARK OFFICE
CERTIFICATE OF CORRECTION

PATENT NO. : 6,878,184 B1
DATED : April 12, 2005
INVENTOR(S) : Joerg Rockenberger et al.

It is certified that error appears in the above-identified patent and that said Letters Patent is hereby corrected as shown below:

Column 2,
Line 50, replace "agent" with -- agents --.
Line 62, replace "embodiment" with -- embodiments --.

Column 5,
Line 61, replace "in" with -- is --.

Column 7,
Line 1, replace "bean" with -- beam --.
Line 32, delete "a".
Line 54, replace "typical" with -- typically --.

Column 14,
Line 55, replace "comprise" with -- comprises --.

Column 16,
Line 9, replace "herein" with -- wherein --.

Signed and Sealed this

Nineteenth Day of July, 2005

JON W. DUDAS
*Director of the United States Patent and Trademark Office*